Figure 1:
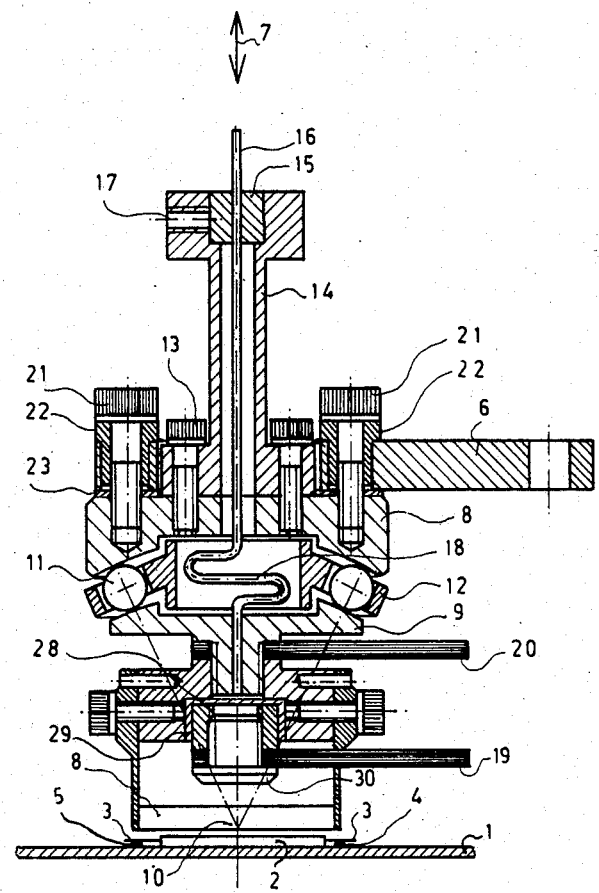

United States Patent [19]

Herrmann

[11] Patent Number: 4,648,543

[45] Date of Patent: Mar. 10, 1987

[54] DEVICE FOR SOLDERING AN ELEMENT TO A PRINT PLATE

[75] Inventor: Eggert Herrmann, Gauting, Fed. Rep. of Germany

[73] Assignee: Weld-Equip b.v., Helmond, Netherlands

[21] Appl. No.: 620,128

[22] Filed: Jun. 13, 1984

[30] Foreign Application Priority Data

Jun. 24, 1983 [NL] Netherlands ............... 8302262

[51] Int. Cl.⁴ .............................................. B23K 3/04
[52] U.S. Cl. ................................................... 228/6.2
[58] Field of Search ...................... 219/85 D, 85 G; 228/6.2, 44.7; 254/29 A

[56] References Cited

U.S. PATENT DOCUMENTS 3,749,362 7/1973 O'Connor et al. ............ 254/29 A
4,255,644 3/1981 Delorme ..................... 228/44.7 X

OTHER PUBLICATIONS

IBM Technical Disclosure Bulletin, vol. 11, No. 8, Jan. 1969, "Self-Leveling Soldering Tool", by N. F. Jensen.

Primary Examiner—Frederick R. Schmidt
Assistant Examiner—Steven P. Schad
Attorney, Agent, or Firm—Lackenbach Siegel Marzullo & Aronson

[57] ABSTRACT

A device for fastening by soldering an element having a plurality of laterally projecting, substantially coplanar connecting wires to a print plate comprising a bracket holder capable of performing a movement in a direction substantially perpendicular to the surface of the print plate and comprising a bracket heated, for example, by electric current, to the desired soldering temperature and practically simultaneously soldering all connections at the correct places of the print substrate during the movement of the bracket holder; wherein the bracket holder comprises a part carrying the soldering bracket and a part connected with a mechanism for producing the movement of the bracket holder, the parts bearing one on the other by concentric spherical surfaces and being held in contact with one another solely by spring force.

7 Claims, 7 Drawing Figures

DEVICE FOR SOLDERING AN ELEMENT TO A PRINT PLATE

The invention relates to a device for soldering an element having a plurality of laterally projecting, substantially coplanar connections to a print plate. The invention furthermore relates to a soldering bracket holder for use in such a device and to a soldering bracket connected with said bracket holder.

Fastening component parts to so-called print plates provided with printed wiring is performed, in principle, in two ways. In one method the ends of an element to be electrically connected to the printed wiring are passed through holes in the print plate and usually fastened on the other side to the printed wiring by soldering. In the other method no holes are provided in the print plate, instead the connections of the elements to be fastened are directly established by soldering on the conductors of the print plate. The latter method is usually carried out when the element has a large number of projecting connections to be fastened. Such an element, for example, an integrated circuit, usually termed flat pack may be formed by a substantially flat plate from which protrude very thin connections on different, or opposite sides. These thin connecting wires have to be fastened to the corresponding soldering spots of the printed wiring. Particularly in the case of a large number of connections this is a time-consuming operation, if all connections have to be made one by one at the soldering spots. In order to mitigate this inconvenience a bracket holder has been constructed, by means of which a plurality of connections can be simultaneously soldered. For this purpose such a bracket holder comprises a conductive strip which is brought to the required temperature by the passing current. The strip is mechanically pressed against the wire ends and heated so that the wire ends and the solder provided on the print at the conductors are heated, as a result of which the soldering joint is established. Obviously in such a method very severe requirements have to be satisfied by correct positioning of the element to be fastened with respect to the wiring on the print plate, by the correct place of the pressing soldering element, by the temperature of the soldering element, by the pressing force of the bracket holder and by the flatness of the print plate. It has been found that particularly in the case of very thin or very short wire ends it is very difficult to satisfy simultaneously all these requirements. This is due inter alia to the fact that print plates are usually not perfectly flat and that the amount of tin covering the print plate and the protruding connections of the element to be fastened is not always the same. When the connectors are pressed against the printed wiring, it therefore often occurs that some joints are excessively heated and other joints insufficiently. These problems are particularly troublesome when the element to be fastened has, for example, a rectangular section and the connections protrude from the four sides of the rectangle. For fastening such an element a rectangular, closed pressing bracket is used, which has to heat all joints simultaneously to the desired temperature for establishing a solid soldering joint. The main object of the present invention is to mitigate these inconveniences and at the same time to obtain specific advantages, which will be described more fully hereinafter.

A device according to the invention for soldering an element having a plurality of laterally protruding, substantially coplanar connections to a print plate comprises a bracket holder capable of performing a movement in a direction substantially perpendicular to the surface of the print plate. This bracket holder comprises a bracket to be heated to the desired soldering temperature, for example, by electric current; when the bracket holder is moved, this bracket practically simultaneously solders all joints at the correct spots on the print plate. The device embodying the invention is characterized in that the bracket holder comprises a part carrying a soldering bracket and a part connected with a mechanism for producing the movement of the bracket holder, said parts being in contact with one another by concentrical spherical surfaces and being pressed one against the other solely by spring force.

Since the two parts of the bracket holder embodying the invention are bearing one on the other by spherical surfaces, centering is automatically produced when the bracket is pressed against the connections so that all irregularities of the flatness of the print plate and of the amount of soldering tin at the protruding connections and on the conductors of the print substrate are compensated for. In a particular, preferred embodiment the two concentric surfaces have their centers approximately in the pressure plane and on the axis of the soldering bracket, that is to say, when pressed down, substantially on the print plate. This provides the best compensation.

Although the friction of the two concentric spherical surfaces can be minimized by precision treatment, it is advantageous in a specific embodiment of the invention to arrange a plurality of balls, for example, steel balls between the two concentric spheres. Thus the friction between the spherical surfaces, is, of course, reduced.

Although it is, of course, possible to fix the position of the balls mentioned in the preceding paragraph by means of recesses in the two spherical surfaces, it is advantageous to use a ball cage by which the balls are held at the correct relative distances.

The spring force by which the two concentric spherical surfaces have to be pressed to one another may be produced either by compression springs or by tensile springs. In a particular embodiment of the invention it is structurally advantageous to use a tensile spring forming the sole fixed connection between the two parts of the bracket holder. Such a tensile spring is preferably formed by a wire of spring steel having an S-shaped bend located between the spots where the spring is fastened to the respective parts of the bracket holder. Such a wire has the advantage that not only a force can be exerted in the direction of length of the wire, but also some lateral play can be simply produced. Such a lateral play automatically occurs when pressing the bracket holder on the connections and the print plate.

Preferably the spring force is rendered adjustable. If as described above a spring mainly formed by a wire is used, said adjustability consists in that the place where the spring is fastened to the upper part of the bracket holder remote from the print substrate can be varied.

The concentric spherical surfaces preferably consist, at least on their proximal sides, of hardened, nitrided steel.

Since the soldering bracket has to be heated by electric current it is preferably fastened to two electrically relatively insulated parts of the bracket support, that is to say, of the lower part of the bracket holder, each of these parts being connected to a supply wire for the current passing through the bracket.

The two relatively insulated parts of this carrier preferably constitute together a cross, each limb of which is provided at the head end with a tapped hole for receiving fastening bolts to fix the soldering bracket. Such a construction may also be used in a bracket holder not having spherical surfaces separated from one another.

In a preferred embodiment of the cross referred to in the preceding paragraph two parts having recesses and extensions respectively are used, which fit one into the other with the interposition of insulating material so that the centre lines of the bolts are located substantially in the same plane. With such a cross it is preferred to use a soldering bracket comprising a closed, for example, rectangular part, each of the sides of the rectangle having in the middle an upright strip having at the other end a hole for passing a bolt to fasten to the head ends of the cross.

Figure 2:
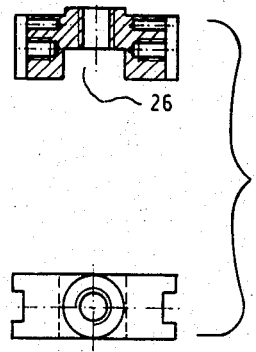
Figure 3:
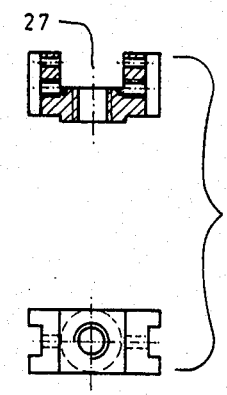
Figure 5:
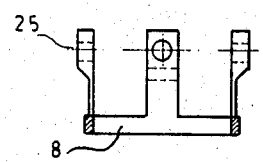
Figure 7:
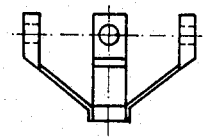
Figure 4:
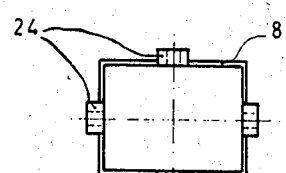
Figure 6:
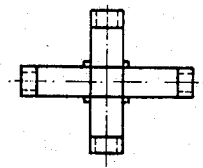

The invention will now be described more fully with reference to a drawing which shows in FIG. 1 a cross-sectional view of a bracket holder embodying the invention arranged above a print plate and an element to be fixed thereto, FIGS. 2, 2a and 3, 3a the two parts of the cross-shaped carrier, FIG. 4 a plan view of the soldering bracket, FIG. 5 a side elevation of the soldering bracket of FIG. 4, FIG. 6 a plan view of a further embodiment of a soldering bracket and FIG. 7 a side elevation of the soldering bracket of FIG. 6.

Referring to FIG. 1, reference numeral 1 designates the print plate with the element 2 lying on it. This element has protruding connections 3, which have to be soldered to the soldering spots 4 and 5. Reference numeral 6 designates a holder connected with a mechanism (not shown), by which the whole bracket holder can be moved up and down in the direction indicated by the arrow 7. During the downward movement of the head the soldering bracket 40, which is heated to the temperature required for soldering, exerts pressure on the wires 3 in a manner to be described hereinafter and solders them to the spots 4 and 5. The bracket holder furthermore comprises two dish-like parts 8 and 9 having concentric spherical surfaces facing one another. The centre of these spherical surfaces is located in the bottom plane of the soldering bracket 40 at 10. The dish-like parts 8 and 9 are separated by balls 11 arranged in a ball cage 12. The dish 8 is connected by means of bolts 13 with a flange of a pipe 14. At the top end said pipe has a second flange with which the tensile spring 16 is connected by means of an intermediate piece 15. The tensile spring 16 is slidably journalled in the intermediate piece 15. By means of a set bolt which can be inserted into the hole 17 the tensile spring can be fixed at different heights. The tensile spring 16 is rigidly secured on the other side to the dish 9. Between the dishes 8 and 9 the tensile spring has an S-shaped bend 18, which brings about the tensile spring effect proper. From the drawing it will be apparent that the sole fixed connection between the dishes 8 and 9 is formed by the tensile spring. The element 6 is rigidly secured by means of bolts 21 to the dish 8. When the element 6 moves down, the dish 8 will also move down. Through the balls 11 the dish 9 is then also urged downwards and hence also the soldering bracket 40 connected herewith. Since the two dishes 8 and 9 are relatively movable, the soldering bracket 40 assumes a position such that all connecting wires are struck with the same force. It is thus ensured that all connecting wires are correctly soldered independently of the imperfections of flatness of the print plate or of the amount of solder on the connecting wires and the fastening spots on the print plate.

The current required for heating the soldering bracket 40 is fed by means of the current supply elements 19 and 20. Since element 20 is in electrically conductive contact with the dish 9 and through the spring 16 with the pipe 14, it is desired to insulate the pipe 14 against the element 6. Therefore, the fastening bolts 21 are fastened in the element 6 with the interposition of insulating sleeves 22. Moreover, an insulating plate 23 is arranged between the element 6 and the dish 8.

The current is supplied to the bracket by means of the current supply elements 19 and 20. The current supply elements 19 and 20 are conductively connected to the parts of the cross-like the carrier element shown in FIGS. 2, 2a and 3, 3a so the current is supplied to one set of opposite, upright strips 24 and current is conducted away from the other set of opposite, upright strips 24.

The soldering bracket 40 (see FIGS. 4 and 5) comprises a closed, rectangular, strip-shaped part. Each of the sides of this rectangle has in the middle an upright strip 24. The ends of these strips have holes 25 for passing a bolt for fastening to the carrier of the soldering bracket. In the embodiment shown said carrier comprises two relatively fitting, crossed parts, which are insulated one against the other and fastened to one another. These crossing parts are shown in FIGS. 2 and 3 in a cross-sectional view and in FIGS. 3 and 3a in a bottom view. The part shown in FIGS. 2, 2a is located on the top side and is rigidly secured with the aid of a screwthread joint with the dish 9. On the lower side said part has a recess 26 corresponding with the recess 27 in the lower part shown in FIGS. 3 and 3a. The lower part shown in FIGS. 3 and 3a is arranged in a cross-like manner in the upper part shown in FIGS. 2 and 2a. The head ends of the parts shown in FIGS. 2, 2a and 3, 3a have tapped holes for receiving bolts which pass through the holes 25 (see FIG. 5) in the upright parts of the soldering bracket. Between the two crossing parts is interposed insulating material 28 and 29 respectively so that the two parts are electrically insulated from one another. The current is supplied to the lower part through the connecting strip 19, which is fastened by means of a belt 30 to the lower part of the cross-shaped carrier of the soldering bracket. In this bracket holder the current is passed through the connection 20, part of the dish 9 to two opposite limbs of the soldering bracket, through two halves of the soldering bracket to the two further upright limbs of the soldering bracket and then to the second current supply connection 19. Alternating current as well as direct current may be used for heating. Owing to the specific cross-shaped construction of the two relatively insulated parts of the carrier of a soldering bracket the openings for the fastening bolts of the soldering bracket are located substantially in the same plane. This has the advantage that soldering brackets of different structures can be used without the need for modifications of the bracket holder proper. The soldering bracket itself may have different dimensions determined by the size of the element to be fastened to the print plate. FIGS. 6 and 7 show, by way of example, a soldering bracket in which the soldering element proper is a small square, the dimensions of the sides of which are markedly smaller than the distance between the head ends of the supporting cross. If it is desired to change over from one soldering bracket to another soldering bracket, for example, from that of FIGS. 4 and 5 to that of FIGS. 6 and 7, it is only necessary to unscrew one bracket and to screw the other bracket at its place. By means of a bracket holder construction according to the invention, therefore, a large number of soldering brackets can be used, even if these soldering brackets do not have a rectangular shape, but exhibit any arbitrary shape, for example, that of a circle.

Since the temperature of the soldering bracket has to be kept constant within very narrow limits, a thermo-element is fastened to a suitable place of the soldering bracket for controlling the heating current through the soldering bracket.

Although in the foregoing reference is made to a bracket holder for soldering an element having protruding connecting wires for a print substrate, it will be obvious that the self-setting bracket holder may as well be used for other purposes, for example for stamping or burning in given characters on a background.

Where in the foregoing reference is made to a plate or a print substrate this is to be understood to mean any suitable support for printed wiring, for example, an epoxy plate, glass-fibre reinforced paper, synthetic resin or ceramic material. The device embodying the invention is particularly suitable for printed wiring on a flexible support of the kind used in the automobile industry.

I claim:

1. In a device for soldering an element having a plurality of laterally projecting, substantially coplanar connecting wires to a print plate, such device comprising: a bracket holder capable of performing movement in a direction substantially perpendicular to the surface of the print plate; a soldering bracket supported by the bracket holder and heated by electric current, for substantially simultaneously pressing the connecting wires to connection spots on the print plate and soldering the wires thereto during movement of the bracket holder; said bracket holder comprising a first part affixed to the soldering bracket and a second part affixed to a mechanism for producing movement of the bracket holder; the improvement characterized in that said first and second parts of said bracket holder have concentric spherical surfaces, and said device further comprises a tensioned spring located between and fastened to said parts which exerts a tensile force thereon radially to said spherical surfaces; whereby said spherical surfaces are brought to bear against each other substantially solely by the radial force exerted thereon by said tensioned spring.

2. A device as claimed in claim 1 characterized in that the centre of the two concentric spherical surfaces is located substantially in the plane of the pressing force and on the axis of the soldering bracket.

3. A device as claimed in claim 1 or 2 characterized in that a number of balls are arranged between the concentric spherical surfaces.

4. A device as claimed in claim 1 characterized in that the tensile spring is formed by a spring steel wire having an S-shaped bend located between the places where the spring is fastened to the respective parts of the soldering head.

5. A device as claimed in claim 1 or 2 characterized in that the spring force is adjustable.

6. A device in accordance with claim 1, wherein said bracket holder comprises a carrier member having two parts which form together a cross, two of the limbs of said cross being fastened to said soldering bracket and electrically insulated therefrom; and current supply conductors connected through said electrically insulated limbs to said soldering bracket for supplying heating current thereto.

7. A device in accordance with claim 6, wherein said soldering bracket comprises a rectangular-shaped mounting portion which is fastened to said soldering bracket carrier.

* * * * *